United States Patent
Chen et al.

[11] Patent Number: 5,999,397
[45] Date of Patent: Dec. 7, 1999

[54] METHOD FOR PREVENTING ELECTROSTATIC DISCHARGE DAMAGE TO AN INSULATING ARTICLE

[75] Inventors: Ming-Fa Chen; Shih-Shiung Chen; Ying-Chen Chao, all of Hsin-Chu, Taiwan

[73] Assignee: Taiwan Semiconductor Manufacturing Company, Ltd., Hsin-Chu, Taiwan

[21] Appl. No.: 08/958,531

[22] Filed: Oct. 27, 1997

[51] Int. Cl.$^6$ .................................................... H05F 01/00
[52] U.S. Cl. ............................................. 361/212; 361/270
[58] Field of Search ................................... 361/212, 220; 206/719–721

[56] References Cited

U.S. PATENT DOCUMENTS

| | | | |
|---|---|---|---|
| 4,327,832 | 5/1982 | De Matteo | 361/220 |
| 4,463,851 | 8/1984 | Cecil | 361/220 |
| 4,702,371 | 10/1987 | Hoshi et al. | 361/212 |
| 5,150,786 | 9/1992 | McAllister | 361/212 |

*Primary Examiner*—Fritz Fleming
*Attorney, Agent, or Firm*—Tung & Associates

[57] ABSTRACT

The present invention discloses a method for preventing electrostatic discharge damages to an article that is made of an insulating material and stored in a container also made of an insulating material by maintaining a minimum safe distance between the article and the top lid of the container such that a saturation electric field cannot be reached at such safety distance and thus electrostatic discharge does not occur. The present invention novel method can be utilized in carrying any insulating articles but is particularly suitable for carrying a quartz reticle in a polycarbonate pod.

12 Claims, 1 Drawing Sheet

$d_1$ = 1 cm
D = 5 cm
X = 0.2286 cm for 5 inch reticle
X = 0.6350 cm for 6 inch reticle $d_1$ = 1 cm
D = 5 cm
X = 0.2286 cm for 5 inch reticle
X = 0.6350 cm for 6 inch reticle 100
METHOD FOR PREVENTING ELECTROSTATIC DISCHARGE DAMAGE TO AN INSULATING ARTICLE

FIELD OF THE INVENTION

The present invention generally relates to a method for preventing electrostatic discharge (ESD) damage to an article made of an insulating material that is stored in a container also made of an insulating material and more particularly, relates to a method for preventing ESD damage to a chrome coated insulating material that is stored in a thermoplastic container.

BACKGROUND OF THE INVENTION

In the semiconductor fabrication process, a square cross-sectional or rectangular cross-sectional container made of a plastic material is frequently used to transport articles. These articles may include silicon wafers, reticles or other substrates used for electronic structures. A reticle is a transparent ceramic substrate that is coated with a metallic layer forming a pattern for an electronic circuit. It is generally used in an imaging step during a photolithographic process wherein a pattern of a circuit is reproduced on the surface of an electronic substrate, i.e., such as a wafer surface.

A reticle can be constructed of any suitable transparent ceramic materials. However, one of the most commonly used material is quartz or silicon dioxide. A quartz reticle can be readily coated with a chrome layer at selective areas to reproduce an electrical circuit. The chrome metal layer may be formed by either a pure chromium or a chromium alloy. During a photolithographic imaging process, a light source is projected from one side of the reticle that is coated with the pattern such that the pattern can be reproduced on the surface of a wafer which is positioned on the opposite side of the reticle. The pattern for the electronic circuit coated on the reticle is frequently laid out in a 5× magnification. The true dimensions of the electronic circuit reproduced on the wafer surface can be obtained by suitably adjusting the optical lenses situated between the reticle and the wafer. Metallic coatings other than chrome may also be coated on the surface of the reticle for the circuit lay-out. However, chrome has been found to be an ideal material for its appearance of a brownish tone and its ease of identification by human eyes.

In a semiconductor fabrication facility, static electricity or electrostatic discharge frequently develops on surfaces of articles made of insulating materials when they are touched or rubbed by other insulating materials such as insulating gloves. The electricity is produced based on a triboelectricity theory. The discharge of the static electricity to machines and to human operators can cause damages to semiconductor wafers and process tools. Sometimes, it may even cause injury to a machine operator. In a semiconductor fabrication facility, it is therefore necessary to control ESD by grounding the machines, by controlling the relative humidity, or by building walls and floor coverings with slightly conductive materials such that electrical charges can be routed to ground. When the triboelectricity is suitably controlled, the control of dust and particulate contamination is also enhanced. For instance, the metal racks, pipe lines, cabinets, cables and rails are normally grounded in a facility to an equal potential bar or to a planar ground. The metal pedestals of the raised floor are then connected to the planar ground under the raised floor. To further enhance ESD protection, the metal framework of the clean room wall systems are also connected to the planar ground. Air ionization systems are frequently installed at selected locations in a fabrication facility, to provide additional ESD control.

Despite the elaborate efforts spent in grounding process machines and various facilities, ESD damages still occur in a fabrication facility. A typical example is the occurrence of ESD when an insulating material is shipped or transported in a container made of another insulating material. For instance, when a reticle is transported from a storage facility to a photolithography machine in a container, i.e., a pod, that is normally constructed of a thermoplastic material. Since the reticle itself is an insulating material, i.e., a quartz or other silicon dioxide materials coated with a chrome coating, when the pod is handled by machine operators wearing insulating gloves, the static charge on the pod drastically increases due to friction generated between two insulating articles. Since the pod is not equipped with an anti-electrostatic device, high static electricity is generated on the surface of the pod. For instance, it has been confirmed that the static electricity field generated on a pod surface increases from 0.1 KV/inch to nearly 15 KV/inch when a polycarbonate pod is rubbed with PVC gloves. Such a high static electricity build-up on the surface of the pod immediately causes a electrostatic discharge between the pod and the reticle contained therein. When ESD occurs between the pod and the reticle, the pattern on the reticle surface is usually damaged to such an extent that it can no longer be used for imaging. Conventional air ionization devices installed at a fabrication facility are not useful for preventing such ESD damages.

Others have proposed techniques for controlling or minimizing ESD damages to reticles carried in plastic containers. For instance, anti-electrostatic-type plastic materials, such as Bayon® has been used for the construction of the pod. However, due to its high cost, this type of anti-electrostatic plastic material cannot be widely utilized in a fabrication facility. Still others have proposed the use of gloves that are made of a conductive material such as Propex® such that the generation of electrostatic discharge can be avoided. The high cost of the Propex® gloves prohibit its broad usage in the processing industry.

It is therefore an object of the present invention to provide a method for preventing ESD damages to an insulating article stored in a container made of another insulating material that does not have the drawbacks or shortcomings of the conventional storage methods.

It is another object of the present invention to provide a method for preventing ESD damages to an insulating article stored in a container made of another insulating material that does not require the use of high cost conductive plastic materials or gloves.

It is a further object of the present invention to provide a method for preventing ESD damages to an insulating article stored in a container made of another insulating material which only requires a re-design of the configuration of the container.

It is another further object of the present invention to provide a method for preventing ESD damages to a reticle coated with a chrome pattern and stored in a thermoplastic container such that the chrome pattern on the quartz reticle is not damaged by the occurrence of electrostatic discharge.

It is still another object of the present invention to provide a method for preventing ESD damages to a reticle coated with a chrome pattern and stored in a polycarbonate container by re-designing the height of the container.

It is yet another object of the present invention to provide a method for preventing ESD damage to a reticle coated with a metallic pattern and stored in a thermoplastic container by increasing the distance between the top surface of the reticle and the top lid of the container to larger than a threshold value such that ESD does not occur.

It is still another further object of the present invention to provide a method for calculating a minimum safe distance between the top surface of a reticle stored in a pod and the top lid of the pod such that electrostatic discharge is avoided and the chrome pattern coated on the reticle is not damaged.

SUMMARY OF THE INVENTION

In accordance with the present invention, a method for preventing electrostatic discharge damages to an insulating article stored in a container made of an insulating material by maintaining a minimum distance between the insulating article and the top of the container is provided.

In a preferred embodiment, a method for preventing ESD damage to an article made of a first insulating material and stored in a container made of a second insulating material can be carried out by the operating steps of first providing a container made of a second insulating material equipped with a top lid and a bottom lid, then positioning the article of a first insulating material at a first distance between a bottom surface of the article and the bottom lid of the container, and at a second distance between a top surface of the article and the top lid of the container, then calculating a threshold electric field on the top surface of the article by the equation $E(X, Y, Z) = E_0(X, Y, Z)/d_2^2$ wherein $E_0(X, Y, Z)$ and $d_2$ are known, and determining a saturation electrostatic field of the container, then calculating a minimum second distance $d_2$/min without ESD damage from the equation of $E_{sat} \times 2.54/d_2/\min^2 \leq E(X, Y, Z)$ wherein $E_{sat}$ and $E(X, Y, Z)$ are known.

In another preferred embodiment, a method for preventing electrostatic discharge damage to a reticle stored in a container made of an insulating material can be carried out by the steps of first providing a container made of an insulating material which has a top lid and a bottom lid, then positioning the reticle at a first distance between a bottom surface of the reticle and the bottom lid, and at a second distance between a top surface of the reticle and the top lid of the container, then calculating a threshold electric field on the top surface of the reticle by the equation of $E(X, Y, Z) = E_0(X, Y, Z) d_2^2$ wherein $E_0(X, Y, Z)$ and $d_2$ are known, and determining a saturation electrostatic field of the container, and then calculating a minimum second distance $d_2$ without incurring ESD damages from the equation $E_{sat} \times 2.54/d_2/\min^2 \leq E(X, Y, Z)$ wherein $E_{sat}$ and $E(X, Y, Z)$ are known.

In yet another preferred embodiment, a method for preventing electrostatic discharge damages to a chrome plated quartz reticle stored in a thermoplastic container can be performed by the steps of first providing a thermoplastic container equipped with a top lid and a bottom lid, positioning the reticle at a first distance between a bottom surface of the reticle and the bottom lid, and at a second distance between a top surface of the reticle and the top lid, then calculating a threshold electric field on the top surface of the reticle by the equation of $E(X, Y, Z) = E_0(X, Y, Z)/d_2^2$ wherein $E_0(X, Y, Z)$ and $d_2$ are known, determining a saturation electrostatic field of the thermoplastic container, and then calculating a minimum second distance $d_2$ without ESD damage from the equation $E_{sat} \times 2.54/d_2/\min^2 \leq E(X, Y, Z)$ wherein Esat and $E(X, Y, Z)$ are known.

BRIEF DESCRIPTION OF THE DRAWING

These and other objects, features and advantages of the present invention will become apparent from the following detailed description and the appended drawings in which.

DETAILED DESCRIPTION OF THE PREFERRED EMBODIMENT

Figure 1:
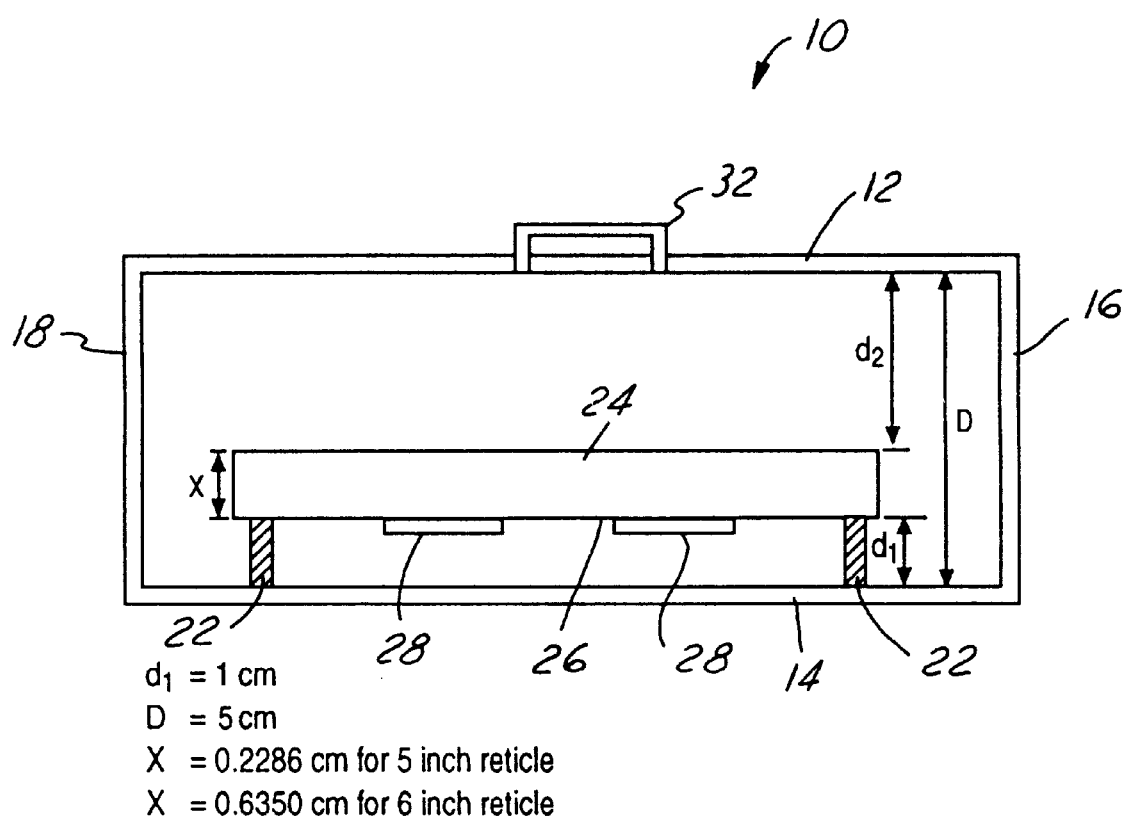
FIG. 1 is a cross-sectional view of a present invention container having a reticle positioned therein and kept away from the top lid of the container to prevent ESD damage.

The present invention discloses a method for preventing electrostatic discharge damages to an article made of an insulating material that is stored in a container also made of an insulating material when electrostatic field is build up on the container upon touching or rubbing with other insulating materials such as PVC gloves. The novel method proposed by the present invention can be used for the storage or transportation of any insulating articles but is particularly suitable for the storage or transportation of quartz reticles in thermoplastic pods frequently utilized in a semiconductor fabrication facility. When a thermoplastic pod is handled by operators wearing PVC or other insulating gloves, the electrostatic field on the pod can drastically increase by 100 folds such that static electricity discharge occurs between the pod and the reticle it carries. As a result, a chrome pattern coated on the reticle surface can be damaged and rendered useless.

Referring initially to FIG. 1 where it is shown a cross-sectional view of a container for use in the present invention novel method. The container 10 is constructed of a top lid 12, a bottom lid 14, a left sidewall 18 and a right sidewall 16. The front and rear sidewalls (not shown) are constructed of similar materials, i.e., a thermoplastic material such as polycarbonate or polymethylmethacrylate. Pedestals 22 are positioned on the bottom lid 14 of the container for supporting a reticle 24. The reticle 24 is normally constructed of a transparent ceramic material such as quartz or other types of silicon dioxide. On a surface 26 of the reticle 24, a pattern 28 is formed by coating the surface with a suitable metallic material. The pattern 28 can be formed by one of many suitable metallic materials. A handle 32 is affixed to the top lid 12 of the container 10 for easy carrying by an operator. The $d_2$ valua for the commercially obtained container is 3.365 cm.

The present invention novel method of preventing electrostatic discharge damages to an insulating article, i.e., such as reticle 24 when stored in container 10 made of an insulating material can be practiced by keeping the reticle 24 at a minimum distance of $d_2$/min from the top lid 12 of the container. As shown in FIG. 1, the thickness of the reticle is X, the distance between the bottom surface 26 of the reticle and the bottom lid 14 is $d_1$, while the total distance between the top lid 12 and the bottom lid 14 is D. It is known from Coulomb's Law, the electric field on the surface of container 10 can be calculated by:

$$E(x,y,z) \; E_0(x,y,z)/d_2^2$$

Wherein $E_0(x,y,z)$ is an electric field generated by insulating gloves rubbing against a polycarbonate pod. From experimental data, $E_0(x,y,z)$ is 14,000 V/inch and 1 inch= 2.54 cm, and thus the threshold electric field on the surface of the reticle can be calculated as:

$$E(x,y,z) \; 14000 \; *2.54/3.365^2 \leq 3140 \text{ V/cm}$$

Since we know the pod saturation electric field is 19,000 V/inch, the minimal distance or the safe distance $d_2$ min can be calculated as the value when the pod saturation electric field reaches just below the threshold electric field. This can be calculated by:

$$19000 * 2.54/d_2/\min \leq 3140 \text{V/cm}$$

$$d_2/\min \leq 3.92 \text{cm}$$

By the present invention novel method, it is therefore possible to calculate the safe distance, or the minimum distance $d_2/\min$ for a six inch reticle placed in a polycarbonate pod.

It should be noted that while in the preferred embodiment, the present invention method is demonstrated by using a quartz reticle having a chrome pattern coated on top and positioned in a polycarbonate pod, the present invention novel method can be utilized in any situations as long as an insulating article is carried in a container that is also made of an insulating material. For instance, any other semiconductor substrate or any other substrate used in thin film transistor technology that is made of an insulating material can be carried in a plastic pod as long as the distance between the substrate and the top lid of the container is maintained at or larger than a minimum distance. Such minimum distance or safety distance can be advantageously calculated by the present invention novel method.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for preventing electrostatic discharge damage (ESD) to an article made of a first insulating material and stored in a container made of a second insulating material comprising the steps of:

providing a container made of a second insulating material equipped with a top lid and a bottom lid, positioning said article of a first insulating material at a first distance ($d_1$) between a bottom surface of the article and said bottom lid, and at a second distance ($d_2$) between a top surface of the article and said top lid, calculating a threshold electric field (E (X, Y, Z)) on the top surface of the article by the equation of E (X, Y, Z)=$E_0$ (X, Y, Z, )/$d_2^2$ wherein $E_0$ (X, Y, Z) and $d_2$ are known, determining a saturation electrostatic field ($E_{sat}$) of the container, and calculating a minimum second distance $d_2/\min$ without incurring ESD damages from the equation of $E_{sat} \times 2.54/d_2/\min^2 \leq E$ (X, Y, Z) wherein $E_{sat}$ and E (X, Y, Z) are known.

2. A method according to claim 1, wherein said $d_2/\min$ is 3.92 cm when said container is a polycarbonate pod and said article is a six-inch $SiO_2$ reticle.

3. A method according to claim 1, wherein said $E_0$ (X, Y, Z) is 14,000 and $d_2$ is 3.365 for a $SiO_2$ reticle.

4. A method according to claim 1, wherein said $E_{sat}$ is 19,000 for a polycarbonate pod.

5. A method for preventing electrostatic discharge damage (ESD) to a reticle stored in a container made of an insulating material comprising the steps of:

providing a container made of an insulating material having a top lid and a bottom lid, positioning said reticle at a first distance ($d_1$) between a bottom surface of the reticle and said bottom lid, and at a second distance ($d_2$) between a top surface of the reticle and said top lid, calculating a threshold electric field (E (X, Y, Z)) on the top surface of the reticle by the equation of E (X, Y, Z)=$E_0$ (X, Y, Z)/$d_2^2$ wherein $E_0$ (X, Y, Z) and $d_2$ are known, determining a saturation electrostatic field ($E_{sat}$) of the container, and calculating a minimum second distance $d_2/\min$ without incurring ESD damage from the equation $E_{sat} \times 2.54/d_2/\min^2 \leq E$ (X, Y, Z) wherein $E_{sat}$ and E (X, Y, Z) are known.

6. A method according to claim 5, wherein said $d_2/\min$ is 3.92 cm when said container is a polycarbonate pod and said reticle is a chrome coated silicon oxide.

7. A method according to claim 5, wherein said $E_0$ (X, Y, Z) is 14,000 and $d_2$ is 3.365 for a $SiO_2$ reticle.

8. A method according to claim 5, wherein said $E_{sat}$ is 19,000 for a container made of polycarbonate.

9. A method for preventing electrostatic discharge damage (ESD) to a chrome coated quartz reticle stored in a thermoplastic container comprising the steps of:

providing a thermoplastic container having a top lid and a bottom lid, positioning said reticle at a first distance ($d_1$) between a bottom surface of the reticle and said bottom lid, and at a second distance ($d_2$) between a top surface of the reticle and said top lid, calculating a threshold electric field (E (X, Y, Z)) on the top surface of the reticle by the equation of E (X, Y, Z)=$E_0$ (X, Y, Z)/$d_2^2$ wherein $E_0$ (X, Y, Z) and $d_2$ are known, determining a saturation electrostatic field ($E_{sat}$) of the thermoplastic container, and calculating a minimum second distance $d_2/\min$ without incurring ESD damage from the equation of $E_{sat} \times 2.54/d_2/\min^2 \leq E$ (X, Y, Z) wherein $E_{sat}$ and E (X, Y, Z) are known.

10. A method according to claim 9, wherein said $d_2/\min$ is 3.92 cm when said container is a polycarbonate pod.

11. A method according to claim 9, wherein said $E_0$ (X, Y, Z) is 14,000 and $d_2$ is 3.365 for said chrome coated quartz.

12. A method according to claim 9, wherein said $E_{sat}$ is 19,000 for a thermoplastic container made of polycarbonate.

* * * * *